United States Patent
Cai

(10) Patent No.: US 11,555,869 B2
(45) Date of Patent: *Jan. 17, 2023

(54) MAGNETIC SENSOR AND POSITION DETECTION DEVICE

(71) Applicant: TDK Corporation, Tokyo (JP)

(72) Inventor: Yongfu Cai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/409,031

(22) Filed: Aug. 23, 2021

(65) Prior Publication Data

US 2021/0382121 A1 Dec. 9, 2021

Related U.S. Application Data

(63) Continuation of application No. 16/653,233, filed on Oct. 15, 2019, now Pat. No. 11,125,839.

(30) Foreign Application Priority Data

Nov. 16, 2018 (JP) .............................. JP2018-215361

(51) Int. Cl.
  *G01R 33/09* (2006.01)
  *G01R 33/00* (2006.01)

(52) U.S. Cl.
  CPC ....... *G01R 33/091* (2013.01); *G01R 33/0005* (2013.01)

(58) Field of Classification Search
  CPC ............................ G01R 33/091; G01R 33/0005
  See application file for complete search history.

(56) References Cited

U.S. PATENT DOCUMENTS

| 9,454,979 | B1 | 9/2016 | Lu et al. |
| 11,125,839 | B2 * | 9/2021 | Cai .................... G01R 33/0023 |

(Continued)

FOREIGN PATENT DOCUMENTS

| DE | 11 2016 006 539 T5 | 11/2018 |
| EP | 1 696 213 A2 | 8/2006 |

(Continued)

OTHER PUBLICATIONS

English translation of Office Action dated Oct. 27, 2020 in corresponding DE application No. 102019129019.8.

*Primary Examiner* — Reena Aurora
(74) *Attorney, Agent, or Firm* — Posz Law Group, PLC

(57) ABSTRACT

A magnetic sensor capable of reducing noise caused by an interference magnetic field and capable of outputting a highly accurate signal in accordance with changes in a detected magnetic field includes a magnetic detection element, a first magnetic body having a first surface and a second surface, which is opposite to the first surface, and a second magnetic body positioned approximately in the center of the first magnetic body in the short direction on the first surface of the first magnetic body. The magnetic detection element is provided to be opposite to the second magnetic body with the first magnetic body interposed in between and positioned approximately in the center of the first magnetic body in the short direction. The magnetic sensing direction of the magnetic detection element is a direction approximately parallel to the short direction of the first magnetic body and the second magnetic body, and a width W1 of the first magnetic body is larger than a width W2 of the second magnetic body.

15 Claims, 6 Drawing Sheets

(56) References Cited

U.S. PATENT DOCUMENTS

| | | |
|---|---|---|
| 2006/0192553 A1 | 8/2006 | Recio et al. |
| 2007/0279053 A1 | 12/2007 | Taylor et al. |
| 2009/0284254 A1 | 11/2009 | Kasajima |
| 2010/0259257 A1 | 10/2010 | Sasaki et al. |
| 2013/0299930 A1 | 11/2013 | Paci et al. |
| 2014/0043713 A1 | 2/2014 | Isowaki et al. |
| 2016/0245877 A1 | 8/2016 | Deak |
| 2016/0327616 A1 | 11/2016 | Deak |
| 2019/0056460 A1 | 2/2019 | Tanabe |
| 2020/0158791 A1* | 5/2020 | Marauska ................ G01D 5/16 |
| 2021/0223334 A1* | 7/2021 | Granig .................. G01R 33/09 |

FOREIGN PATENT DOCUMENTS

| | | |
|---|---|---|
| JP | 2009-300150 A | 12/2009 |
| JP | 2014-038671 A | 2/2014 |
| JP | 2016-535845 A | 11/2016 |
| JP | 2017-502298 A | 1/2017 |
| JP | 2017-181068 A | 10/2017 |
| WO | 2009-084434 A1 | 9/2009 |

\* cited by examiner

MAGNETIC SENSOR AND POSITION DETECTION DEVICE

CROSS-REFERENCE TO RELATED APPLICATIONS

The present application is a continuation application of U.S. utility application Ser. No. 16/653,233 filed on Oct. 15, 2019, which is based on Japanese Patent Application No. 2018-215361 filed on Nov. 16, 2018, the contents of which are incorporated herein by reference.

TECHNICAL FIELD

The present invention relates to a magnetic sensor and position detection device.

RELATED ART

In recent years, in a variety of applications, physical quantity detection devices (position detection devices) for detecting physical quantities (for example, position and movement amount (change amount) or the like caused by rotational movement or linear movement of a moving body) have been used. As such a physical quantity detection device, one equipped with a magnetic sensor capable of detecting change in an external magnetic field is known, and a signal in accordance with the change in the external magnetic field is output from the magnetic sensor.

The magnetic sensor includes a magnetic sensor element for detecting the detected magnetic field, and as the magnetic sensor element, a magnetoresistive effect element (AMR element, GMR element, TMR element or the like) in which resistance changes in accordance with change in the external magnetic field, or a Hall element that utilizes the so-called Hall effect, or the like, has been known.

This kind of magnetic sensor element includes a prescribed used magnetic field range, and consequently, when the magnetic field strength of the magnetic field that is applied to the magnetic field element is outside the used magnetic field range, it is necessary to adjust the magnetic field strength of this magnetic field within the used magnetic field range. Conventionally, to adjust the magnetic field strength of the magnetic field applied to the magnetic sensor element, a magnetic sensor that has a magnetic shield for attenuating the magnetic field strength is known (see Patent Literature 1~2).

RELAYED LITERATURE

Patent Literature

[PATENT LITERATURE 1] National Patent Publication No. 2016-535845
[PATENT LITERATURE 2] National Patent Publication No. 2017-502298

OVERVIEW OF THE INVENTION

Problem to be Solved by the Invention

In the above described magnetic sensor, a signal in accordance with change in the detected magnetic field is output by matching the magnetic field direction of the magnetic field to be detected (detected magnetic field) and the magnetic sensing direction of the magnetic sensor element. A position detection device including the magnetic sensor has a magnetic field generator (for example, a magnet or the like) capable of generating the detected magnetic field. However, not only the detected magnetic field but also a magnetic field (interference magnetic field) with a magnetic field direction differing therefrom is also generated by the magnetic field generator. This interference magnetic field may be superimposed on the detected magnetic field and applied to the magnetic sensor element while changing the magnetic field direction. As a result, noise occurs in the signal in accordance with change in the detected magnetic field, which causes a measurement error. In particular, through demand for miniaturization of position detection devices, greater compactness is required of magnetic sensors (magnetic sensor packages), so that the distance between the magnetic sensor element and the magnetic field generator becomes smaller, and as a result, there is a risk that noise caused by the interference magnetic field will become large.

In the above-described magnetic sensor, the magnetic field strength of the magnetic field applied to the magnetic sensor element is adjusted within the use magnetic field range of the magnetic sensor element, but the magnetic field strength of the magnetic field that should truly be detected is not the only one adjusted, creating a problem in noise resistance caused by the interference magnetic field.

In consideration of the foregoing, it is an object of the present invention to provide a magnetic sensor and position detection device capable of reducing noise caused by the interference magnetic field and capable of outputting a highly accurate signal in accordance with changes in the detected magnetic field.

Means for Solving the Problem

In order to resolve the above-described problem, the present invention provides a magnetic sensor including: a magnetic detection element; a first magnetic body having a first surface and a second surface, which is opposite to the first surface, where the first magnetic body has an approximately rectangular shape in a plan view; and a second magnetic body on the first surface of the first magnetic body, where the second magnetic body has an approximately rectangular shape in the plan view and is positioned approximately in the center of the first magnetic body in the short direction in the plan view. The magnetic detection element is provided to be opposite to the second magnetic body with the first magnetic body interposed between the second magnetic body and the magnetic detection element, and the magnetic detection element is positioned approximately in the center of the first magnetic body in the short direction in the plan view. A magnetic sensing direction of the magnetic detection element is a direction approximately parallel to the short direction of the first magnetic body and the second magnetic body, and a width W1 of the first magnetic body in the short direction is larger than a width W2 of the second magnetic body in the short direction.

In this magnetic sensor, the relationship between the width W1 of the first magnetic body in the short direction and the width W2 of the second magnetic body in the short direction is preferably a relationship such that an external magnetic field in a direction orthogonal to the magnetic sensing direction of the magnetic detection element and parallel to the direction of thickness of the first magnetic body and the second magnetic body is effectively not converted to a magnetic field in the magnetic sensing direction.

In this magnetic sensor, a ratio W2/W1 of the width W2 of the second magnetic body in the short direction to the width W1 of the first magnetic body in the short direction may be 0.2~0.8, the thickness T1 of the first magnetic body may be smaller than the thickness T2 of the second magnetic body, and a ratio T2/T1 of the thickness T2 of the second magnetic body to the thickness T1 of the first magnetic body may be 2~20.

In this magnetic sensor, the cross-sectional shape of the second magnetic body along the direction of thickness may be approximately trapezoidal or approximately reverse trapezoidal, the width W2 of the second magnetic body in the short direction may be at least 15 μm and less than 30 μm, and the thickness T2 of the second magnetic body may be 3~20 μm.

In this magnetic sensor, the second magnetic body may be provided in contact with the first surface of the first magnetic body, or the second magnetic body may be provided at a prescribed interval from the first surface of the first magnetic body.

In this magnetic sensor, the magnetic detection elements may be provided side-by-side at a prescribed interval along the lengthwise direction of the first magnetic body and electrically connected in series, or the magnetic detection elements may be provided side-by-side at a prescribed interval along the short direction of the first magnetic body and electrically connected in series. In the latter case, a group consisting of the magnetic detection elements provided side-by-side along the short direction of the first magnetic body in the plan view may be positioned approximately in the center of the first magnetic body. In addition, in this magnetic sensor, the magnetic detection elements may be provided side-by-side in a matrix array at prescribed intervals along the lengthwise direction and the short direction of the first magnetic body and electrically connected in series.

In this magnetic sensor, the first magnetic bodies can be provided side-by-side at a prescribed interval along the short direction of the first magnetic body, the second magnetic body can be positioned on the first surface of each of the first magnetic bodies, and the magnetic detection element can be positioned opposite to each of the second magnetic bodies with each of the first magnetic bodies interposed in between.

In addition, the present invention provides a position detection device including a magnetic detection part that outputs a detection signal based on the change in an external magnetic field accompanying movement of a moving body, and a position detection part that detects the position of the moving body based on the detection signal output from the magnetic detection part. The magnetic detection part includes the above-described magnetic sensor.

Efficacy of the Invention

With the present invention, it is possible to provide a magnetic sensor and position detection device capable of reducing noise caused by interference magnetic fields and capable of outputting a highly accurate signal in accordance with changes in the detected magnetic field.

EMBODIMENT(S) OF THE INVENTION

An embodiment of the present invention will be described with reference to the drawings.

Figure 1:
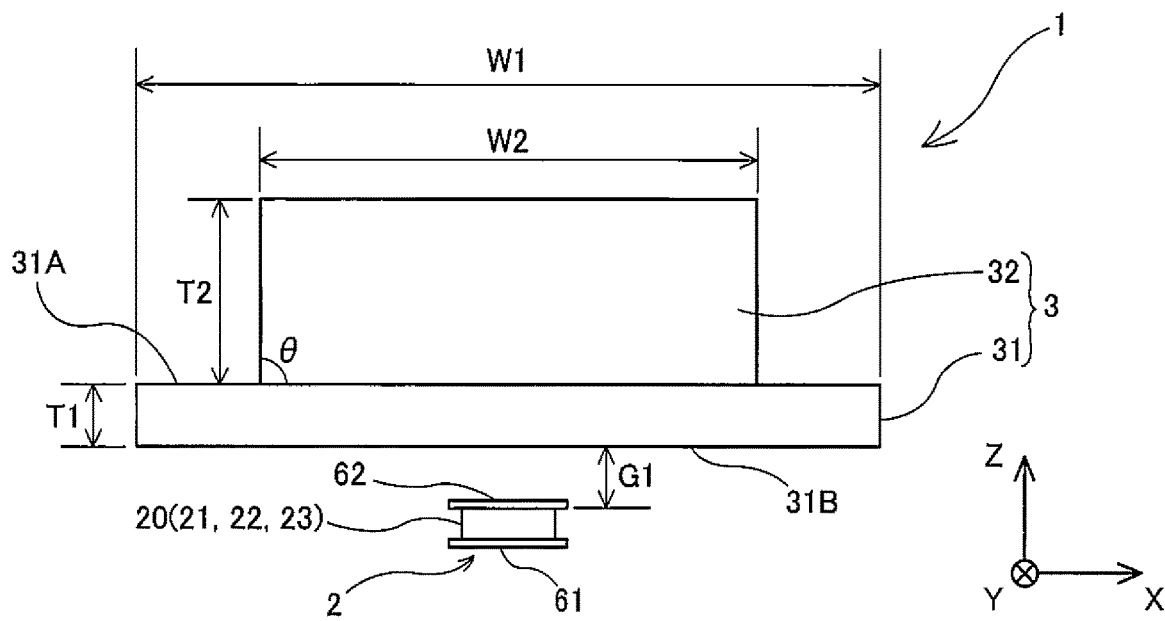
FIG. 1 is a side view showing a schematic configuration of a magnetic sensor according to an embodiment of the present invention.
Figure 2:
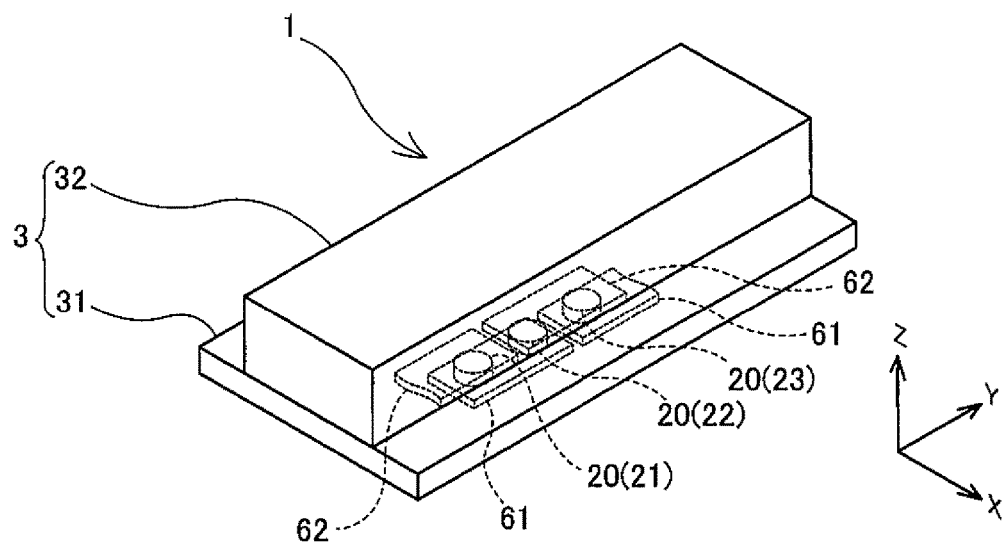
FIG. 2 is a perspective view showing a schematic configuration of a magnetic sensor according to the embodiment of the present invention.
Figure 3:
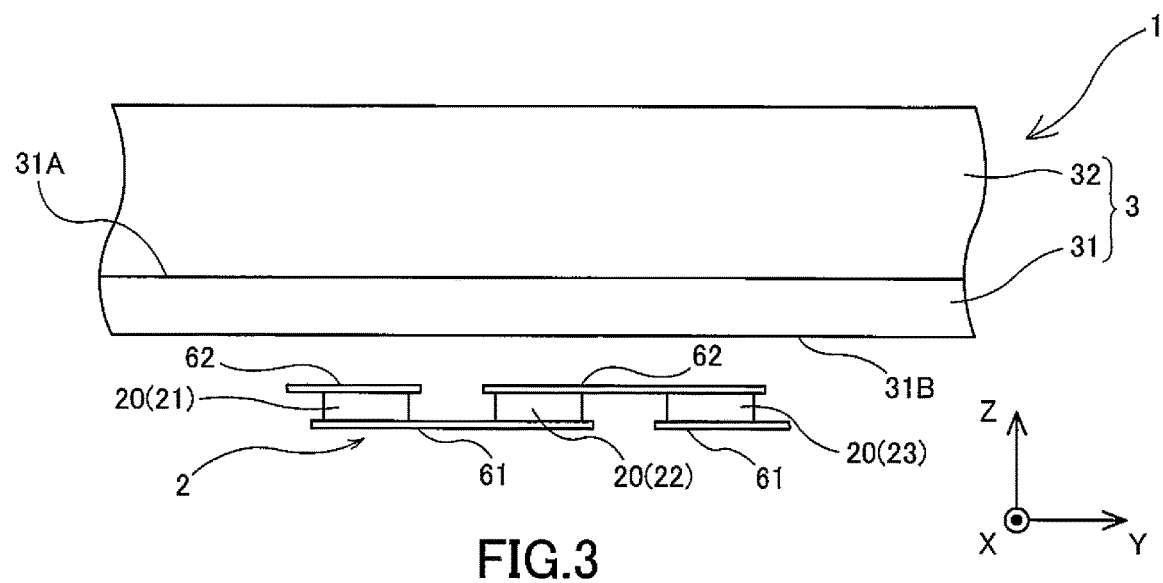
FIG. 3 is a side view showing a schematic configuration of a magnetic sensor according to the embodiment of the present invention.
Figure 4:
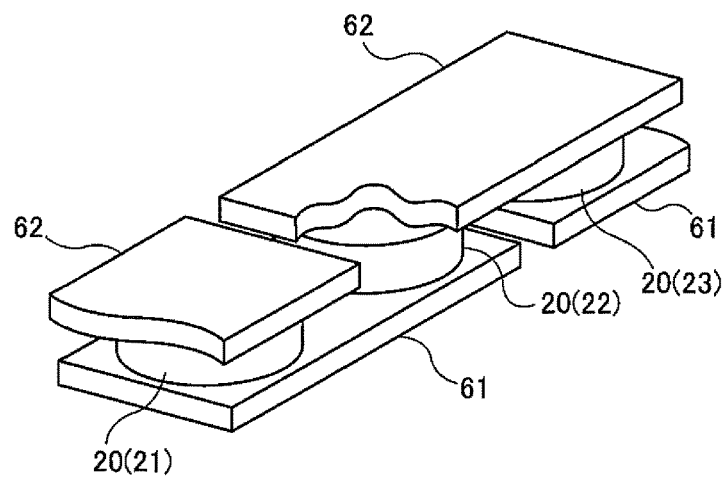
FIG. 4 is a perspective view showing a schematic configuration of a magnetic sensor element part in the embodiment of the present invention.
Figure 5:
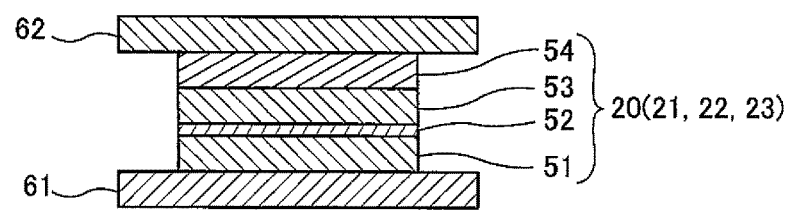
FIG. 5 is a cross-sectional view showing a schematic configuration of a magnetic sensor element in the embodiment of the present invention.
Figure 6:
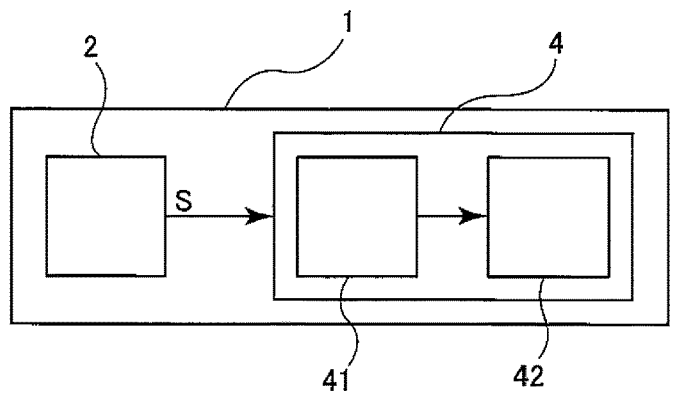
FIG. 6 is a block diagram showing a schematic configuration of the magnetic sensor according to the embodiment of the present invention.
Figure 7:
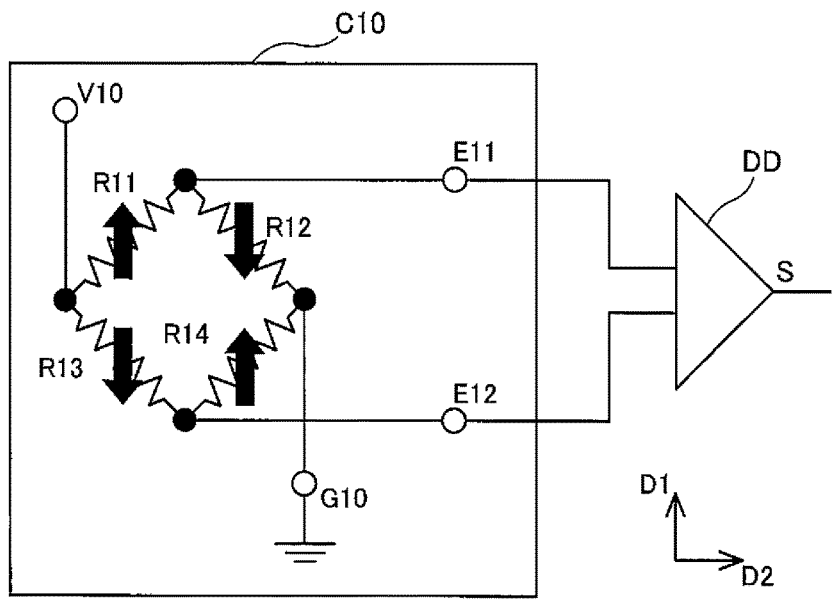
FIG. 7 is a circuit diagram showing a schematic configuration of one aspect of the circuit configuration possessed by the magnetic sensor according to the embodiment of the present invention.
Figure 8:
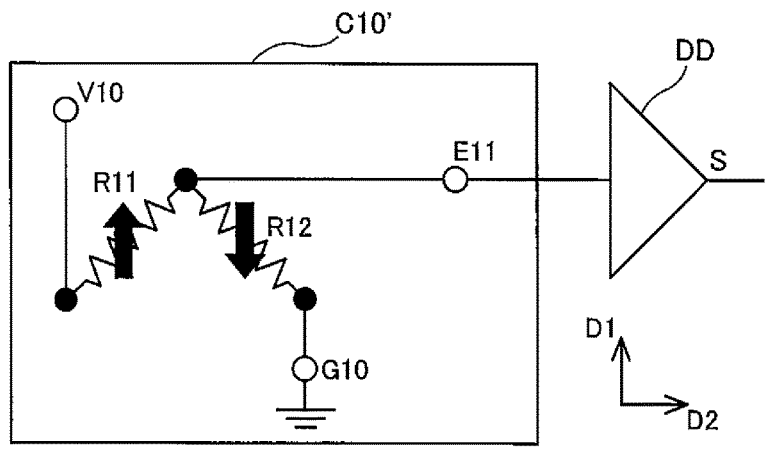
FIG. 8 is a circuit diagram showing a schematic configuration of another aspect of the circuit configuration possessed by the magnetic sensor according to the embodiment of the present invention.

FIG. 1 is a side view showing a schematic configuration of a magnetic sensor according to this embodiment, FIG. 2 is a perspective view showing a schematic configuration of a magnetic sensor according to this embodiment, FIG. 3 is a side view showing a schematic configuration of a magnetic sensor according to this embodiment, FIG. 4 is a perspective view showing a schematic configuration of a magnetic sensor element part in this embodiment, FIG. 5 is a cross-sectional view showing a schematic configuration of a magnetic sensor element part in this embodiment, FIG. 6 is a block diagram showing a schematic configuration of the magnetic sensor according to this embodiment, FIG. 7 is a circuit diagram showing a schematic configuration of one aspect of the circuit configuration possessed by the magnetic sensor according to this embodiment, and FIG. 8 is a circuit diagram showing a schematic configuration of another aspect of the circuit configuration possessed by the magnetic sensor according to this embodiment.

In the magnetic sensor according to this embodiment, in some drawings, the "X-axis direction, Y-axis direction and Z-axis direction" are defined, as necessary. Here, the X-axis direction and the Y-axis direction are mutually orthogonal directions within the plane of the magnetic sensor part, and the Z-axis direction is the direction of thickness of the magnetic sensor part.

The magnetic sensor 1 according to this embodiment is provided with at least one magnetic detection element part 2 that outputs a sensor signal S based on the change in an external magnetic field, a magnetic shield 3 provided on top of the magnetic detection element part 2 in the Z-axis direction, and a calculation part 4 that calculates a physical quantity based on the sensor signal S.

The magnetic shield 3 has a first magnetic shield 31 having a roughly rectangular shape in the plan view and including a first surface 31A and a second surface 31B opposite to the first surface 31A, and a second magnetic shield 32 positioned on the first surface 31A of the first magnetic shield 31 and positioned in roughly the center of the first magnetic shield 31 in the short direction. The first magnetic shield 31 and the second magnetic shield 32 may be integrated or may be separate.

The magnetic shield 3 (the first magnetic shield 31 and the second magnetic shield 32) is preferably configured by a soft magnetic material having a relatively high magnetic permeability (for example, a magnetic permeability of $2\times10^{-5}$~$8\times10^{4}$ (Him)). For example, the following can be cited: spinel ferrites such as MnZn ferrite, NiZn ferrite, CuZn ferrite or the like; hexagonal ferrites such as barium ferrite, strontium ferrite or the like; garnet ferrites such as yttrium-iron-garnet (YIG) ferrite or the like; $\gamma$-$Fe_2O_3$ (maghemite); permalloy (NiFe); CoFe, CoFeSiB; CoZrNb; or the like.

In the magnetic shield 3, a width W1 of the first magnetic shield 31 in the short direction may be larger than a width W2 of the second magnetic shield 32 in the short direction, and the relationship between these widths W1 and W2 may preferably be a relationship such that the magnetic field (interference magnetic field) in the Z-axis direction of the external magnetic field is substantially not converted to a magnetic field in the X-axis direction (the magnetic sensing direction of the magnetic sensor element). Here, "the magnetic field in the Z-axis direction is substantially not converted to a magnetic field in the X-axis direction" means that the conversion rate of the magnetic field in the Z-axis direction to a magnetic field in the X-axis direction is 1.1% or less, and this conversion rate is preferably 0.8% or less, and particularly preferably, 0.5% or less. Here, the "conversion rate of the magnetic field in the Z-axis direction to a magnetic field in the X-axis direction" is the value of the magnetic field strength in the X-axis direction sensed by the magnetic detection element part 2 having a magnetic detection element 20 with a magnetic sensing direction in the X-axis direction, when a magnetic field in the Z-axis direction of a prescribed magnetic field strength is applied to the magnetic sensor 1, found as a percentage of the magnetic field strength of the applied magnetic field in the Z-axis direction.

The ratio (W2/W1) of the width W2 of the second magnetic shield 32 in the short direction to the width W1 of the first magnetic shield 31 in the short direction is preferably 0.2~0.8, and more preferably 0.2~0.7. If this ratio (W2/W1) is 0.2~0.8, it is possible to make the conversion rate of the magnetic field in the Z-axis direction to the magnetic field in the X-axis direction 0.8% or less, so that a highly accurate signal can be output from the magnetic detection element part 2 in accordance with change in the magnetic field in X-axis direction (the detected magnetic field) that should be detected by the magnetic sensor 1. On the other hand, when the above-described ratio (W2/W1) exceeds 0.8, the conversion rate of the magnetic field in the Z-axis direction to the magnetic field in X-axis direction tends to become large, creating the fear that the signal output from the magnetic detection element part 2 will include noise.

The width W2 of the second magnetic shield 32 in the short direction is preferably 15 μm or more but less than 30 μm, and more preferably 22~26 μm. When the width W2 of the second magnetic shield 32 in the short direction is less than 15 μm, there is a concern that the properties of the magnetic sensor 1 could fluctuate greatly due to misalignment in the X-axis direction of the magnetic shield 3 and the magnetic detection element part 2 (magnetic detection element 20) (misalignment created by variations at the time of manufacturing), and when this is at least 30 μm, there is a fear that the magnetic shield 3 will be saturated.

The thickness T1 of the first magnetic shield 31 is preferably smaller than the thickness T2 of the second magnetic shield 32, and the ratio (T2/T1) of the thickness T2 to the thickness T1 is preferably 2~20, and particularly preferably, 2~16.7. If the thickness T1 is smaller than the thickness T2 and the above-described ratio (T2/T1) is 2~20, it is possible for the magnetic field in the Z-axis direction to effectively not be converted to the magnetic field in the X-axis direction, so that a highly accurate signal in accordance with changes in the magnetic field in the X-axis direction (detected magnetic field) to be detected by the magnetic sensor 1 can be output from the magnetic detection element part 2. On the other hand, when the above-described ratio (T2/T1) is less than 2 or exceeds 20, the conversion rate of the magnetic field in the Z-axis direction to the magnetic field in the X-axis direction readily becomes large, creating the fear that noise will be included in the signal output from the magnetic detection element part 2.

The thickness T2 of the second magnetic shield 32 is preferably 3~20 μm, and more preferably 6~15 μm. When the thickness T2 of the second magnetic shield 32 is less than 3 μm, there is a fear that the second magnetic shield 32 will be saturated by the magnetic field in the X-axis direction, and the function of the second magnetic shield 32 as a shield against the magnetic field in the X-axis direction will diminish. When 20 μm is exceeded, there is a fear that creating the second magnetic shield 32 using a typical wafer process in semiconductor manufacturing will become difficult.

The length of the magnetic shield 3 (the first magnetic shield 31 and the second magnetic shield 32) in the lengthwise direction is not particularly limited, and for example may be around 30~300 μm. In the present embodiment, the first magnetic shield 31 and the second magnetic shield 32 have the same length as each other in the lengthwise direction (see FIG. 2), but this is intended to be illustrative and not limiting. The length of the first magnetic shield 31 in the lengthwise direction may be longer than the length of the second magnetic shield 32 in the lengthwise direction if the efficacy of the magnetic shield 3 in the present embodiment can be exhibited.

When the side surface of the short side of the second magnetic shield 32 is viewed, the angle θ formed by both side surfaces of the second magnetic shield 32 (both side surfaces in the lengthwise direction) and the bottom surface (the first surface 31A of the first magnetic shield 31) is around 80~100°, and preferably around 85~95°.

In the present embodiment, the magnetic detection element part 2 is opposite to the second magnetic shield 32 so that the first magnetic shield 31 is interposed in between, with a prescribed gap G1 provided to the first magnetic shield 31, and is positioned roughly in the center of the first magnetic shield 31 in the short direction (the X-axis direction) in a plan view. The gap G1 is the length in the Z-axis direction between the second surface 31B of the first magnetic shield 31 and the magnetic detection element part 2 (the magnetic detection element 20).

The magnetic detection element part 2 is configured with a plurality of magnetic detection elements 20 (in the example shown in the drawing, a first magnetic detection element 21, a second magnetic detection element 22 and a third magnetic detection element) lined up along the lengthwise direction (Y-axis direction) of the magnetic shield 3 and electrically connected in series via an upper electrode 62 and a lower electrode 61 (see FIG. 2).

MR elements such as TMR elements, GMR elements, AMR elements or the like can be used as the various magnetic detection elements 20 (the first magnetic detection element 21, the second magnetic detection element 22 and the third magnetic detection element 23) configuring the magnetic detection element part 2 and using TMR elements is particularly preferable. TMR elements and GMR elements have a magnetization fixed layer in which the magnetization direction is fixed, a free layer in which the magnetization direction changes in accordance with the direction of an applied magnetic field, and a nonmagnetic layer positioned between the magnetization fixed layer and the free layer.

The MR elements as each of the magnetic detection elements 20 (first magnetic detection element 21, second magnetic detection element 22 and third magnetic detection element 23) are provided, one near each end in the lengthwise direction, on the top surface of the lower electrode 61 provided on a substrate (undepicted). The MR elements as each of the magnetic detection elements 20 (first magnetic detection element 21, second magnetic detection element 22 and third magnetic detection element 23) include a free layer 51, a nonmagnetic layer 52, a magnetization fixed layer 53 and an antiferromagnetic layer 54, layered in that order from the lower electrode 61 side. The free layer 51 is electrically connected to the lower electrode 61. The antiferromagnetic layer 54 is configured by an antiferromagnetic material and fills the role of fixing the direction of magnetization of the magnetization fixed layer 53 by causing exchange coupling with the magnetization fixed layer 53. The upper electrodes 62 are provided on the plurality of MR elements (magnetic detection elements 20 (first magnetic detection element 21, second magnetic detection element 22 and third magnetic detection element 23)). The MR elements (magnetic detection elements 20 (first magnetic detection element 21, second magnetic detection element 22 and third magnetic detection element 23)) may have a configuration in which the free layer 51, the nonmagnetic layer 52, the magnetization fixed layer 53 and the antiferromagnetic layer 54 are layered in that order from the upper electrode 62 side.

In a TMR element, the nonmagnetic layer 52 is a tunnel bather layer. In a GMR element, the nonmagnetic layer is a nonmagnetic conductive layer. In a TMR element or a GMR element, the resistance value changes in accordance with the angle between the direction of magnetization of the free layer 51 and the direction of magnetization of the magnetization fixed layer 53. The resistance value is a minimum when this angle is 0° (when the magnetization directions are parallel to each other), and the resistance value is a maximum when the angle is 180° (when the magnetization directions are antiparallel to each other).

As the circuit configuration possessed by the magnetic sensor 1 according to the present embodiment, for example, a Wheatstone bridge circuit C10 (see FIG. 7) including a pair of magnetic sensor element parts connected in series can be cited. The Wheatstone bridge circuit C10 includes a power source port V10, a ground port G10, two output ports E11 and E12, a first pair of magnetic sensor element parts R11 and R12 connected in series and a second pair of magnetic sensor element parts R13 and R14 connected in series. One end each of the magnetic sensor element parts R11 and R13 is connected to the power source port V10. The other end of the magnetic sensor element part R11 is connected to one end of the magnetic sensor element part R12 and to the output port E11. The other end of the magnetic sensor element part R13 is connected to one end of the magnetic sensor element part R14 and to the output power E12. One end each of the magnetic sensor element parts R12 and R14 is connected to the ground port G10. A power source voltage of a prescribed magnitude is applied to the power source port V10, and the ground port G10 is connected to ground. Each of the magnetic sensor element parts R11~R14 is configured by magnetic detection element parts 2 (a plurality of magnetic detection elements 20). The circuit configuration the magnetic sensor 1 has may by a half bridge circuit C10' that includes only the first pair of magnetic sensor element parts R11 and R12 and does not include the second pair of magnetic sensor element parts R13 and R14 (see FIG. 8).

When each of the magnetic detection elements 20 that configure the magnetic sensor element parts R11~R14 is a TMR element or a GMR element, the directions of magnetization of the magnetization fixed layers thereof are indicated by the filled-in arrows. The directions of magnetization of the magnetization fixed layers 53 of the magnetic sensor element parts R11~R14 are parallel to a first direction D1 (see FIG. 7), and the magnetization directions of the magnetization fixed layers 53 of the magnetic sensor element parts R11 and R14, and the magnetization directions of the magnetization fixed layers 53 of the magnetic sensor element parts R12 and R13, are mutually antiparallel directions.

In the Wheatstone bridge circuit C10, a sensor signal S is output from the output ports E11 and E12 as a signal indicating the magnetic field strength, in accordance with changes in the external magnetic field. A difference detector DD outputs a signal corresponding to the potential difference between the output ports E11 and E12 to a calculation part 4 as the sensor signal S.

The sensitivity axis (magnetic sensing direction) of each of the magnetic detection elements 20 configuring the magnetic sensor element parts R11~R14 is a direction roughly parallel to the short direction (X-axis direction) of the first magnetic shield 31 and the second magnetic shield 32 in the plan view. As described below, in the present embodiment, it is possible to prevent the magnetic field in the Z-axis direction (interference magnetic field) from the outside magnetic field from effectively being converted into a magnetic field in the X-axis direction, by the magnetic shield 3 (first magnetic shield 31 and second magnetic shield 32). As a result, the change in resistance value based on the strength of the magnetic field in the X-axis direction (the detected magnetic field) that should be detected by the magnetic sensor 1 occurs in the magnetic sensor element parts R11~R14, so a highly accurate signal in accordance with changes in the detected magnetic field is output from the magnetic sensor 1.

The distance (gap) G1 between the second surface 31B of the first magnetic shield 31 and the magnetic detection element part 2 is around 0.5~5 µm and preferably is around 0.5~3 µm. When this gap G1 is less than 0.5 µm, there is a fear that the magnetic field passing through the first magnetic shield 31 will have an effect on the properties of the magnetic detection element part 2, and when this gap exceeds 5 μm, there is a fear that the efficacy of the magnetic shield 3 (first magnetic shield 31) as a shield will be diminished.

Figure 9:
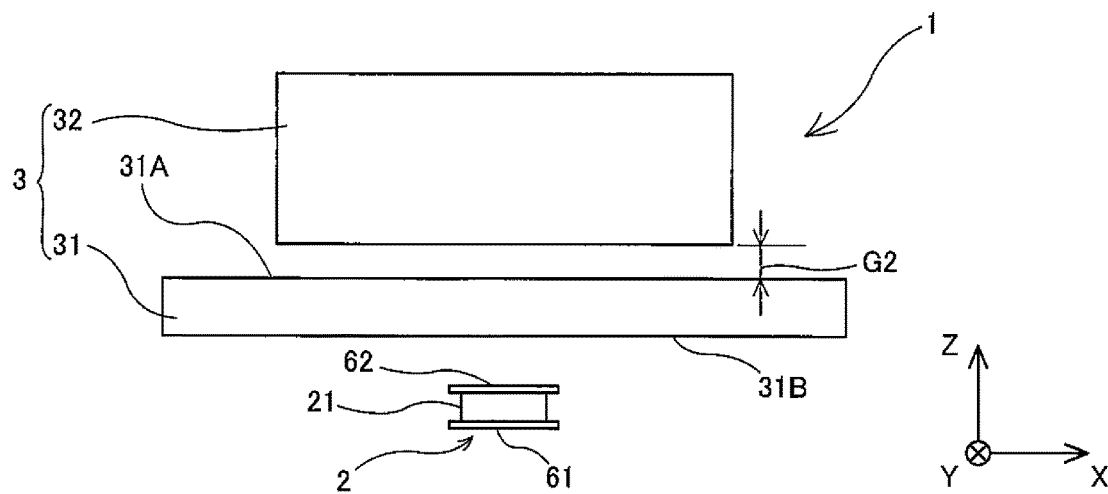
FIG. 9 is a side view showing a schematic configuration of a magnetic sensor according to another embodiment of the present invention.

The second magnetic shield 32 may be provided directly on the first surface 31A of the first magnetic shield 31 (see FIG. 1) or may be provided such that a prescribed gap G2 is formed via an insulating layer between the second magnetic shield 32 and the first surface 31A of the first magnetic shield 31 (see FIG. 9). In this case, the gap G2 between the first surface 31A of the first magnetic shield 31 and the second magnetic shield 32 may be around 0.05~4 μm, for example. When this gap G2 exceeds 4 μm, there is a fear that the efficacy of the second magnetic shield 32 as a shield will be diminished. In addition, it is very difficult to manufacture the magnetic shield 3 in which the interval G2 is less than 0.05 μm.

Figure 10:
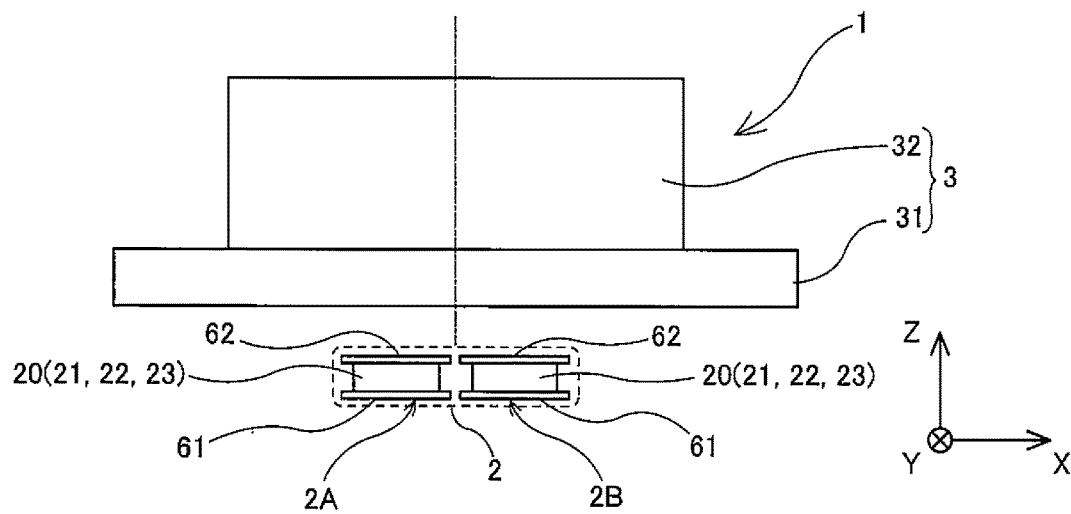
FIG. 10 is a side view showing a schematic configuration of a magnetic sensor according to another embodiment of the present invention.
Figure 11:
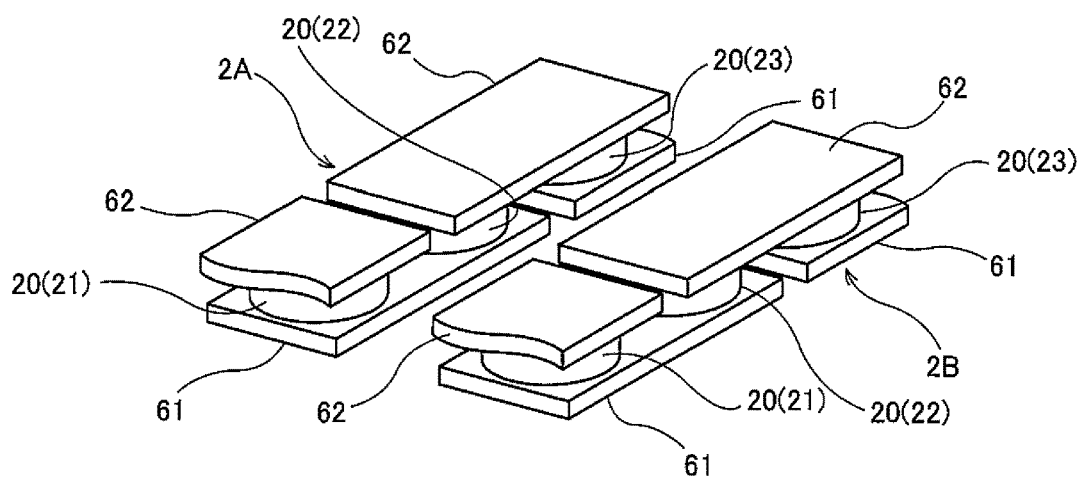
FIG. 11 is a perspective view showing a schematic configuration of the magnetic sensor element part in the magnetic sensor shown in FIG. 10.

In the present embodiment, the magnetic detection element part 2 with which the magnetic sensor 1 is provided may have magnetic detection element parts 2A and 2B provided side-by-side along the short direction of the first magnetic shield 31. For example, as shown in FIG. 10 and FIG. 11, the magnetic detection element part 2 may have a first magnetic detection element part 2A in which magnetic detection elements 20 (first magnetic detection element 21, second magnetic detection element 22 and third magnetic detection element 23) are electrically connected in series, and a second magnetic detection element part 2B in which magnetic detection elements 20 (first magnetic detection element 21, second magnetic detection element 22 and third magnetic detection element 23) are electrically connected in series, and the first magnetic detection element part 2A and the second magnetic detection element part 2B may be provided side-by-side along the short direction of the first magnetic shield 31. That is, the magnetic detection elements 20 may be provided side-by-side in a matrix shape. In this configuration, the first magnetic detection element part 2A and the second magnetic detection element part 2B may be electrically connected in series or may be electrically connected in parallel. In this case, when viewing the side surface of the short side of the magnetic shield 3, the center position of the group made up of the first magnetic detection element part 2A and the second magnetic detection element part 2B (the center position in the short direction of the magnetic shield 3) and the center of the first magnetic shield 31 in the short direction preferably roughly match. By having the centers roughly match each other and having the first magnetic detection element part 2A and the second magnetic detection element part 2B electrically connected in series, the sign of the magnetic field strength of the magnetic field in the Z-axis direction applied to the first magnetic detection element part 2A (the magnetic field converted and applied in the X-axis direction) and the sign of the magnetic field strength of the magnetic field in the Z-axis direction applied to the second magnetic detection element part 2B (the magnetic field converted and applied in the X-axis direction) are opposite, so it is possible to cancel the effect of the magnetic field strength of the magnetic field in the Z-axis direction in the signal output from the magnetic detection element part 2.

The calculation part 4 includes an A/D (analog/digital) converter 41 that converts the analog signal (sensor signal S) output from the magnetic detection element part 2 into a digital signal, and a calculation processor 42 that does calculation processing of the digital signal digitally converted by the A/D converter 41 and calculates the physical quantity.

The A/D converter 41 converts the sensor signal S (analog signal relating to the physical quantity) output from the magnetic detection element part 2 into a digital signal, and this digital signal is input into the calculation processor 42.

The calculation processor 42 accomplishes calculation processing on the digital signal converted from the analog signal by the A/D converter 41 and calculates the physical quantity. The calculation processor 42 is configured by, for example, a microcomputer or the like.

Figure 12:
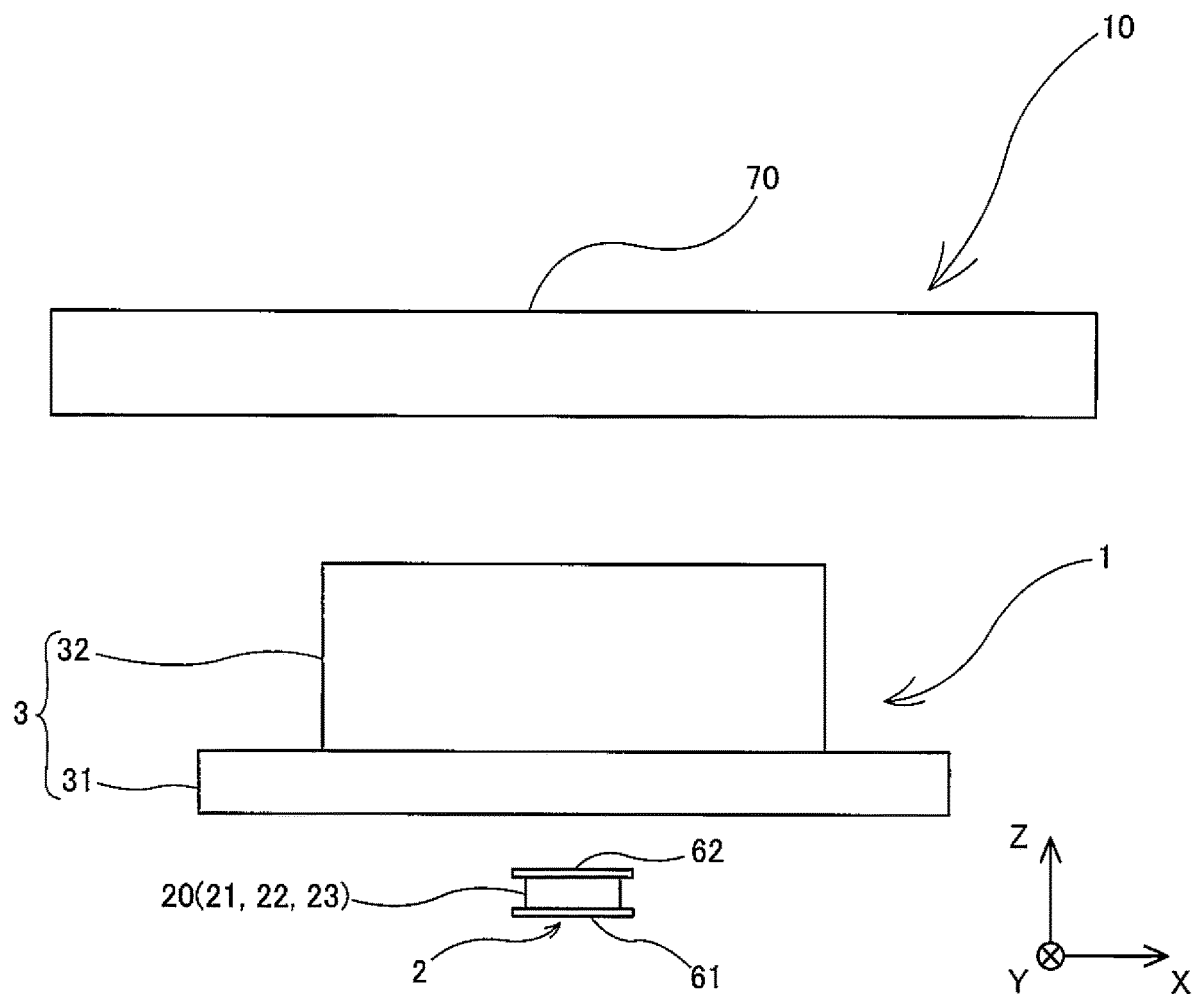
FIG. 12 is a side view showing a schematic configuration of a position detection device in the embodiment of the present invention.

The magnetic sensor 1 having the above-described configuration can be used as one component of a position detection device. FIG. 12 is a side view showing a schematic configuration of a position detection device using the magnetic sensor according to the present embodiment.

The position detection device 10 in the present embodiment is provided with the magnetic sensor 1 according to the present embodiment, and a magnet 70 provided opposite to the magnetic sensor 1 (magnetic shield 3) that is magnetized in the X-axis direction. Since the magnet 70 is provided in a moving body (undepicted), a prescribed signal is output from the magnetic sensor 1 in accordance with changes in the magnetic field caused by movement of the moving body. The position detection device 10 in the present embodiment can be used, for example, in a lens driving mechanism (optical camera-shake correction mechanism) or the like in an imaging device such as a camera or the like.

The calculation processor 42 in the magnetic sensor 1 (see FIG. 6) accomplishes calculation processing on the digital signal converted from the analog signal by the A/D converter 41 (see FIG. 6) and outputs the relative movement amount of the moving body as the physical quantity.

In the position detection device 10 in the present embodiment having the above-described configuration, when the external magnetic field changes accompanying movement of the moving body (magnet 70) relative to the magnetic sensor 1, and accompanying this change in the external magnetic field, the resistance values of the magnetic sensor element parts R11~R14 of the Wheatstone bridge circuit C10 change, and the sensor signal S is output in accordance with the potential difference between the output ports E11 and E12.

The relative movement amount calculated by the calculation processor 42 is output to the electronic control unit (ECU) of the application (e.g., digital camera or the like) in which the position detection device 10 of the present embodiment is installed. In the electronic control unit, the operation of the application (for example, optical system camera-shake correction mechanism or the like) is controlled based on the above-described relative movement amount.

In the position detection device 10 of the present embodiment, the magnetic shield 3 of the magnetic sensor 1 can prevent the magnetic field in the Z-axis direction (interference magnetic field) from being effectively converted into a magnetic field in the X-axis direction, so the sensor signal S output from the Wheatstone bridge circuit C10 responds to the magnetic field in the X-axis direction that is to be detected, without being affected by the magnetic field in the Z-axis direction. Consequently, the relative movement amount of the moving body (magnet 70) can be calculated precisely.

The above-described embodiment was described to facilitate understanding of the present invention and is intended to be illustrative and not limiting. Accordingly, the various components disclosed in the above-described embodiment include all design alternations and equivalents belonging within the technical scope of the present invention.

In the above-described embodiment, the explanation took as an example an aspect in which the magnetic detection elements 20 (first magnetic detection element 21, second magnetic detection element 22 and third magnetic detection element 23) configuring the magnetic detection element part 2 are provided side-by-side along the lengthwise direction (Y-axis direction) of the magnetic shield 3, but this is intended to be illustrative and not limiting. For example, the magnetic detection elements 20 may be provided side-by-side along the short direction (X-axis direction) of the magnetic shield 3. In this case, when the side surface of the short side of the magnetic shield 3 is viewed, preferably the center position of the magnetic detection element part 2 having the plurality of magnetic detection elements 20 (the center position of the magnetic shield 3 in the short direction) and the center position of the first magnetic shield 31 in the short direction roughly match. Through this, the sign of the magnetic field strength of the magnetic field in the Z-axis direction applied to the magnetic detection element 20 positioned on the −X side from the center position of the magnetic detection element part 2 (the magnetic field converted to the X-axis direction and applied) and the sign of the magnetic field strength of the magnetic field in the Z-axis direction applied to the magnetic detection element 20 positioned on the +X side from the center position of the magnetic detection element part 2 (the magnetic field converted to the X-axis direction and applied) are opposite, so the effects of the magnetic field strength of the magnetic field in the Z-axis direction can be cancelled in the signal output from the magnetic detection element part 2.

In the above-described embodiment, the description took as an example an aspect in which the magnetic sensor 1 is provided with one magnetic detection element part 2 and one magnetic shield 3, but it is not limited to this aspect. For example, a plurality of magnetic detection element parts 2 and a plurality of magnetic shields 3 (first magnetic shield 31 and second magnetic shield 32) respectively provided above the plurality of magnetic detection element parts 2 in the Z-axis direction may be provided. In this case, the magnetic sensor may be provided with four magnetic detection element part 2 and four magnetic shields 3, for example, and each of the magnetic sensor element parts R11~R14 in the Wheatstone bridge circuit C10 (see FIG. 7) may be provided through each of the four magnetic detection element parts 2 as the circuit configuration possessed by the magnetic sensor 1. In addition, each of the magnetic sensor element parts R11~R14 may be configured by a plurality of magnetic detection element parts 2 electrically connected in series or parallel.

Embodiment(s)

Below, the present invention is described in further detail by citing test examples and the like, but the present invention is not limited by any of the test examples and the like.

Test Example 1

Figure 13:
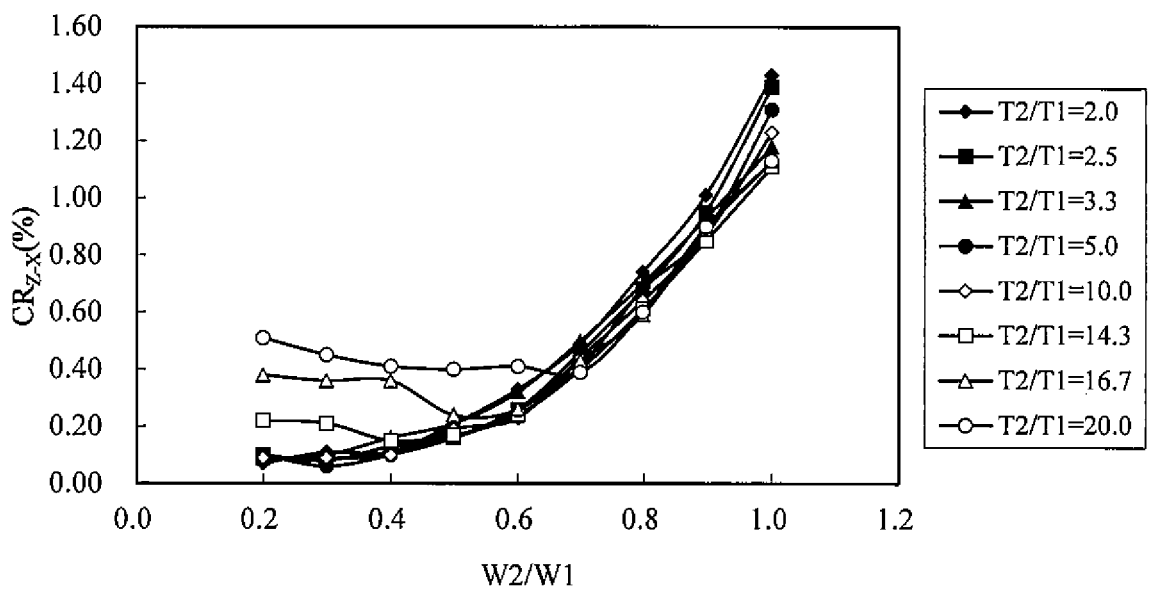
FIG. 13 is a graph showing simulation results in Test Example 1.

In the magnetic sensor 1 provided with the magnetic detection element part 2 (first magnetic detection element 21, second magnetic detection element 22 and third magnetic detection element 23) and the magnetic shield 3 (first magnetic shield 31 and second magnetic shield 32) shown in FIG. 1, when a magnetic field Bz (Bz=100 mT) in the Z-axis direction was applied, the conversion rate $CR_{Z-X}$ (%) of the magnetic field Bz to a magnetic field Bx in the X-axis direction was calculated through simulation. In this simulation, the width W2 of the second magnetic shield 32 in the short direction was taken to be 23 μm, and the width W1 of the first magnetic shield 31 in the short direction was taken to be 23~115 μm (width ratio W2/W1=0.2~1.0). In addition, the thickness T2 of the second magnetic shield 32 was taken to be 10 μm, and the thickness T1 of the first magnetic shield 31 was taken to be 0.5~5 μm (thickness ratio T2/T1=0.5~5). Furthermore, the distance (gap) G1 between the second surface 31B of the first magnetic shield 31 and the magnetic detection element part 2 was taken to be 1 μm. Results are shown in FIG. 13 and Table 1.

TABLE 1

| W1 (μm) | W2 (μm) | W2/W1 | $CR_{Z-X}$ (%) | | | | | | | |
|---|---|---|---|---|---|---|---|---|---|---|
| 23.0 | 23.0 | 1.0 | 1.13 | 1.13 | 1.11 | 1.23 | 1.31 | 1.18 | 1.39 | 1.43 |
| 25.6 | 23.0 | 0.9 | 0.90 | 0.89 | 0.85 | 0.87 | 0.88 | 0.93 | 0.95 | 1.01 |
| 28.8 | 23.0 | 0.8 | 0.60 | 0.59 | 0.61 | 0.64 | 0.68 | 0.70 | 0.68 | 0.74 |
| 32.9 | 23.0 | 0.7 | 0.39 | 0.43 | 0.40 | 0.44 | 0.41 | 0.50 | 0.46 | 0.49 |
| 38.3 | 23.0 | 0.6 | 0.41 | 0.26 | 0.24 | 0.23 | 0.26 | 0.32 | 0.26 | 0.33 |
| 46.0 | 23.0 | 0.5 | 0.40 | 0.24 | 0.17 | 0.19 | 0.16 | 0.21 | 0.16 | 0.21 |
| 57.5 | 23.0 | 0.4 | 0.41 | 0.36 | 0.15 | 0.10 | 0.10 | 0.16 | 0.13 | 0.11 |
| 76.7 | 23.0 | 0.3 | 0.45 | 0.36 | 0.21 | 0.09 | 0.06 | 0.10 | 0.08 | 0.11 |
| 115.0 | 23.0 | 0.2 | 0.51 | 0.38 | 0.22 | 0.09 | 0.10 | 0.09 | 0.10 | 0.07 |
| | T1 (μm) | | 0.5 | 0.6 | 0.7 | 1.0 | 2.0 | 3.0 | 4.0 | 5.0 |
| | T2 (μm) | | 10.0 | 10.0 | 10.0 | 10.0 | 10.0 | 10.0 | 10.0 | 10.0 |
| | T2/T1 | | 20.0 | 16.7 | 14.3 | 10.0 | 5.0 | 3.3 | 2.5 | 2.0 |

Test Example 2

Figure 14:
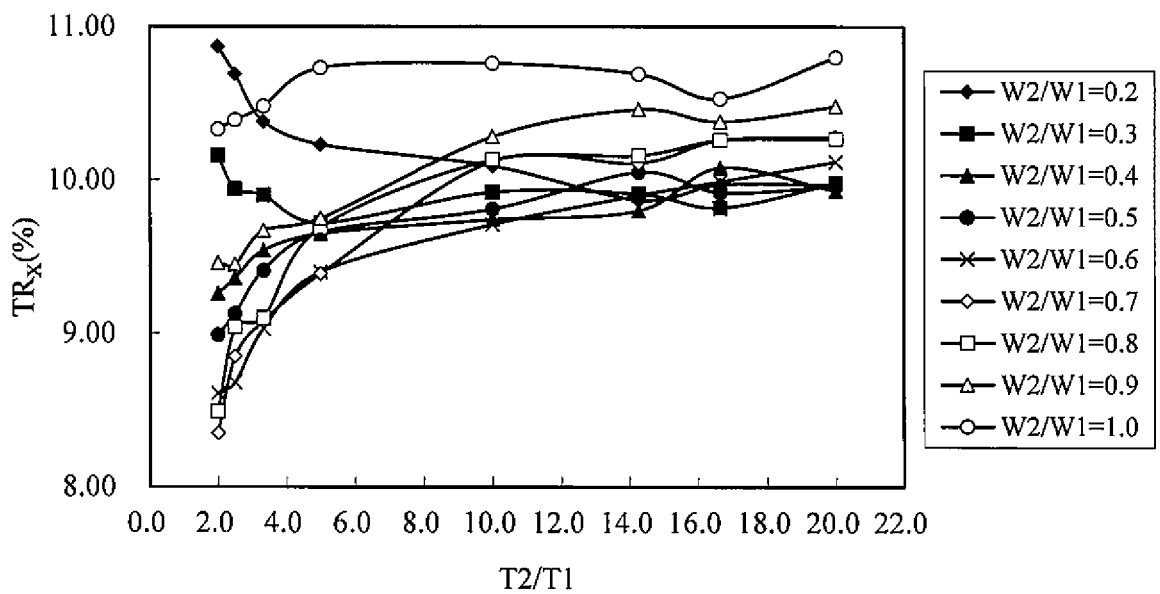
FIG. 14 is a graph showing simulation results in Test Example 2.

The transmittance rate $TR_X$ (%) of the magnetic field Bx in the X-axis direction was calculated through simulation under the same conditions as in Test Example 1 except that instead of the magnetic field Bz (Bz=100 mT) in the Z-axis direction, a magnetic field Bx (Bx=350 mT) in the X-axis direction was applied. Results are shown in FIG. 14 and Table 2. When a magnetic field Bx in the X-axis direction of prescribed magnetic field strength is applied, the transmittance rate $TR_X$ (%) is a value found as the magnetic field strength calculated using the signal output from the magnetic detection element part 2 (the magnetic field strength of the real magnetic field actually applied to the magnetic detection element part 2) as a percentage of the magnetic field strength of the applied magnetic field Bx.

TABLE 2

| W1 (μm) | W2 (μm) | W2/W1 | TR$_X$ (%) | | | | | | | |
|---------|---------|-------|------|------|------|------|------|------|------|------|
| 23.0 | 23.0 | 1.0 | 10.80 | 10.53 | 10.69 | 10.76 | 10.73 | 10.48 | 10.39 | 10.33 |
| 25.6 | 23.0 | 0.9 | 10.48 | 10.38 | 10.46 | 10.28 | 9.75 | 9.67 | 9.45 | 9.46 |
| 28.8 | 23.0 | 0.8 | 10.27 | 10.26 | 10.16 | 10.13 | 9.69 | 9.10 | 9.04 | 8.49 |
| 32.9 | 23.0 | 0.7 | 10.28 | 10.26 | 10.11 | 10.12 | 9.39 | 9.08 | 8.85 | 8.35 |
| 38.3 | 23.0 | 0.6 | 10.12 | 9.99 | 9.90 | 9.71 | 9.40 | 9.03 | 8.68 | 8.61 |
| 46.0 | 23.0 | 0.5 | 9.96 | 9.92 | 10.05 | 9.81 | 9.66 | 9.41 | 9.13 | 8.99 |
| 57.5 | 23.0 | 0.4 | 9.93 | 10.08 | 9.80 | 9.74 | 9.65 | 9.54 | 9.36 | 9.26 |
| 76.7 | 23.0 | 0.3 | 9.98 | 9.82 | 9.91 | 9.92 | 9.72 | 9.90 | 9.94 | 10.16 |
| 115.0 | 23.0 | 0.2 | 9.97 | 9.97 | 9.87 | 10.09 | 10.23 | 10.38 | 10.69 | 10.87 |
| | T1 (μm) | | 0.5 | 0.6 | 0.7 | 1.0 | 2.0 | 3.0 | 4.0 | 5.0 |
| | T2 (μm) | | 10.0 | 10.0 | 10.0 | 10.0 | 10.0 | 10.0 | 10.0 | 10.0 |
| | T2/T1 | | 20.0 | 16.7 | 14.3 | 10.0 | 5.0 | 3.3 | 2.5 | 2.0 |

Test Example 3

The conversion rate $CR_{Z-X}$ (%) of the magnetic field Bz in the Z-axis direction to the magnetic field Bx in the X-axis direction and the transmittance rate $TR_X$ (%) of the magnetic field Bx in the X-axis direction were calculated through simulation the same as in Test Example 1 and Test Example 2, except that the widths W2 of the first magnetic shield 31 and the second magnetic shield 32 in the short direction were both taken to be 40 μm. As a result, the conversion rate $CR_{Z-X}$ (%) was 0.6%, and the transmittance rate $TR_X$ (%) was 60%.

As shown in FIG. 13 and Table 1, when the ratio W2/W1 of the width W2 of the second magnetic shield 32 in the short direction to the width W1 of the first magnetic shield 31 in the short direction is 1.0, that is, when the width W1 of the first magnetic shield 31 and the width W2 of the second magnetic shield 32 are the same and the magnetic shield 3 has a rectangular shape as a whole, it is conjectured that the conversion rate of the magnetic field Bz in the Z-axis direction to the magnetic field Bx in the X-axis direction becomes relatively large, and the noise included in the signal output from the magnetic sensor 1 becomes large.

However, by having the above-described ratio W2/W1 be less than 1.0 (0.2~0.9) and having the width W1 of the first magnetic shield 31 be larger than the width W2 of the second magnetic shield 32, it was clear that reduction of the above-described conversion rate was possible. In addition, by having the above-described ratio W2/W1 be 0.2~0.8, it was clear that the above-described conversion rate could be made to be 0.8% or less. Furthermore, by making the above-described ratio W2/W1 0.2~0.7 and making the thickness ratio T2/T1 of the thickness T2 of the second magnetic shield 32 to the thickness T1 of the first magnetic shield 31 be 2.0~16.7, it was clear that it was possible to reduce the above-described conversion rate to 0.5% or less.

As shown in FIG. 14 and Table 2, it became clear that the conversion rate of the magnetic field Bx in the X-axis direction was roughly constant regardless of the ratio T2/T1 of the thickness T2 of the second magnetic shield 32 to the thickness T1 of the first magnetic shield 31. In addition, contrasting this with the transmittance rate simulation results of Test Example 3, it was confirmed that the transmittance rate was kept low in Test Example 2. In general, when the magnetic shield 3 is saturated, the above-described transmittance rate increases, but in Test Example 2, the above-described transmittance rate is roughly constant at a low value compared to Test Example 3, so it became clear that saturation of the magnetic shield 3 is suppressed regardless of the above-described ratio T2/T1. On the other hand, from the results of Test Example 3, it can be conjectured that in a rectangular-shaped magnetic shield, by making the thickness thereof relatively thick, the magnetic shield 3 is saturated although the above-described conversion rate can be reduced.

DESCRIPTION OF SYMBOLS

1 Magnetic sensor
2 Magnetic detection element part
20 Magnetic detection element
21 First magnetic detection element
22 Second magnetic detection element
23 Third magnetic detection element
3 Magnetic shield
31 First magnetic shield
32 Second magnetic shield
10 Position detection device

The invention claimed is:

1. A magnetic sensor comprising:
   a magnetic detection element;
   a first magnetic body having a first surface and a second surface, which is opposite to the first surface, wherein the first magnetic body has an approximately rectangular shape in a plan view; and
   a second magnetic body on the first surface of the first magnetic body, wherein the second magnetic body has an approximately rectangular shape in the plan view and is positioned approximately in a center of the first magnetic body in a short direction in the plan view;
   wherein the magnetic detection element is provided to be opposite to the second magnetic body with the first magnetic body interposed between the second magnetic body and the magnetic detection element;
   a magnetic sensing direction of the magnetic detection element is a direction approximately parallel to the first surface of the first magnetic body; and
   a width W1 of the first magnetic body in the short direction is larger than a width W2 of the second magnetic body in the short direction.

2. The magnetic sensor according to claim 1, wherein a relationship between the width W1 of the first magnetic body in the short direction and the width W2 of the second magnetic body in the short direction is a relationship such that an external magnetic field in a direction orthogonal to the magnetic sensing direction of the magnetic detection element and parallel to the direction of thickness of the first magnetic body and the second magnetic body is effectively not converted to a magnetic field in the magnetic sensing direction.

3. The magnetic sensor according to claim 1, wherein a ratio W2/W1 of the width W2 of the second magnetic body in the short direction to the width W1 of the first magnetic body in the short direction is 0.2~0.8.

4. The magnetic sensor according to claim 1, wherein the thickness T1 of the first magnetic body is smaller than the thickness T2 of the second magnetic body.

5. The magnetic sensor according to claim 4, wherein a ratio T2/T1 of the thickness T2 of the second magnetic body to the thickness T1 of the first magnetic body is 2~20.

6. The magnetic sensor according to claim 1, wherein the cross-sectional shape of the second magnetic body along the direction of thickness is approximately trapezoidal or approximately reverse trapezoidal.

7. The magnetic sensor according to claim 1, wherein the width W2 of the second magnetic body in the short direction is at least 15 μm and less than 30 μm.

8. The magnetic sensor according to claim 1, wherein the thickness T2 of the second magnetic body is 3~20 μm.

9. The magnetic sensor according to claim 1, wherein the second magnetic body is provided in contact with the first surface of the first magnetic body.

10. The magnetic sensor according to claim 1, wherein the second magnetic body is provided at a prescribed interval from the first surface of the first magnetic body.

11. The magnetic sensor according to claim 1, wherein a plurality of the magnetic detection elements is provided side-by-side at a prescribed interval along the lengthwise direction of the first magnetic body and is electrically connected in series.

12. The magnetic sensor according to claim 1, wherein:
the magnetic detection elements are provided side-by-side at a prescribed interval along the short direction of the first magnetic body; and
a group consisting of the magnetic detection elements provided side-by-side along the short direction of the first magnetic body in the plan view is positioned approximately in the center of the first magnetic body.

13. The magnetic sensor according to claim 1, wherein a plurality of the magnetic detection elements is provided side-by-side in a matrix array at prescribed intervals along the lengthwise direction and the short direction of the first magnetic body.

14. The magnetic sensor according to claim 1, wherein:
a plurality of the first magnetic bodies is provided side-by-side at a prescribed interval along the short direction of the first magnetic body;
the second magnetic body is positioned on the first surface of each of the first magnetic bodies; and
the magnetic detection element is positioned opposite to each of the second magnetic bodies with each of the first magnetic bodies interposed in between.

15. A position detection device comprising:
a magnetic detection part that outputs a detection signal based on the change in an external magnetic field accompanying movement of a moving body; and
a position detection part that detects the position of the moving body based on the detection signal output from the magnetic detection part;
wherein the magnetic detection part includes a magnetic sensor according to claim 1.

* * * * *